US012744084B2

(12) United States Patent
Lecoq et al.

(10) Patent No.: US 12,744,084 B2
(45) Date of Patent: Sep. 22, 2026

(54) METHOD FOR READING A MULTI-LEVEL NON-VOLATILE MEMORY DEVICE, IN PARTICULAR A PHASE-CHANGE MEMORY DEVICE, AND MULTI-LEVEL NON-VOLATILE MEMORY DEVICE

(71) Applicant: STMicroelectronics International N.V., Geneva (CH)

(72) Inventors: Xavier Lecoq, Voiron (FR); Alin Razafindraibe, Saint Martin d'Heres (FR)

(73) Assignee: STMicroelectronics International N.V., Geneva (CH)

( * ) Notice: Subject to any disclaimer, the term of this patent is extended or adjusted under 35 U.S.C. 154(b) by 195 days.

(21) Appl. No.: 18/660,651

(22) Filed: May 10, 2024

(65) Prior Publication Data

US 2024/0386954 A1 Nov. 21, 2024

(30) Foreign Application Priority Data

May 19, 2023 (FR) ...................................... 2304987

(51) Int. Cl.
*G11C 13/00* (2006.01)
*G11C 11/56* (2006.01)

(52) U.S. Cl.
CPC ........ *G11C 13/004* (2013.01); *G11C 11/5678* (2013.01); *G11C 2013/0045* (2013.01); *G11C 2013/0054* (2013.01)

(58) Field of Classification Search
CPC .............. G11C 13/004; G11C 13/0064; G11C 13/0069; G11C 2013/0045; G11C 2013/0054; G11C 13/0097; G11C 2211/5632; G11C 2211/5634; G11C 11/5678; G11C 13/0004; G11C 11/5642; G11C 16/26; G11C 16/06; G11C 16/30
See application file for complete search history.

(56) References Cited

U.S. PATENT DOCUMENTS 8,130,539 B2 3/2012 Yoon
2002/0196664 A1* 12/2002 Pasotti .................... G11C 7/14 365/185.21
2004/0257854 A1 12/2004 Chen et al.
(Continued)

FOREIGN PATENT DOCUMENTS

EP 2052390 B1 6/2015

OTHER PUBLICATIONS

INPI Search Report and Written Opinion for priority application, FR Appl. No. 2304987, report dated Nov. 28, 2023, 9 pgs.
(Continued)

*Primary Examiner* — Jay W. Radke
(74) *Attorney, Agent, or Firm* — Crowe & Dunlevy LLC

(57) ABSTRACT

A multi-level non-volatile memory cell has N levels, N being even and greater than two, corresponding respectively to N logical data that can be stored in the memory cell and to N corresponding read current ranges. A datum stored in the memory cell is read by performing successive comparisons of a read current output by the memory cell with reference currents selected from a set of N−1 reference currents having values respectively lying between two different successive ranges using a dichotomous algorithm starting with the reference current having the median value.

6 Claims, 6 Drawing Sheets

(56) References Cited

U.S. PATENT DOCUMENTS

| | | | | |
|---|---|---|---|---|
| 2005/0276138 | A1 | 12/2005 | Inoue | |
| 2008/0170444 | A1* | 7/2008 | Hoenigschmid .... | G11C 11/5678 365/185.33 |
| 2008/0316803 | A1 | 12/2008 | Lin et al. | |
| 2009/0168493 | A1* | 7/2009 | Kim ................... | G11C 13/0069 257/E47.001 |
| 2011/0122684 | A1* | 5/2011 | Sheu ................... | G11C 11/5678 365/163 |
| 2014/0153326 | A1 | 6/2014 | Wang et al. | |
| 2021/0035638 | A1* | 2/2021 | Vianello ............ | G11C 13/0007 |

OTHER PUBLICATIONS

Calligaro C et al: "Dichotomie Current-Mode Serial Sensing Methodology for Multistorage Non-Volatile Memories," Circuits and Systems Proceedings, Proceedings of the 38th Mid West Symposium On Rio De Janeiro, Brazil Aug. 13-16, 1995, New York, NY, USA,IEEE, US, vol. 1 (Aug. 13, 1995) pp. 302-305, XP010165128.

* cited by examiner

METHOD FOR READING A MULTI-LEVEL NON-VOLATILE MEMORY DEVICE, IN PARTICULAR A PHASE-CHANGE MEMORY DEVICE, AND MULTI-LEVEL NON-VOLATILE MEMORY DEVICE

PRIORITY CLAIM

This application claims the priority benefit of French Application for Patent No. 2304987, filed on May 19, 2023, the content of which is hereby incorporated by reference in its entirety to the maximum extent allowable by law.

TECHNICAL FIELD

The embodiments and implementations relate to multi-level non-volatile memories, in particular phase-change memories (PCM) or non-volatile floating-gate memories, for example FLASH memories or memories with a buried selection transistor, and more particularly the reading of such memories.

BACKGROUND

Non-volatile memories typically store binary data on two levels corresponding to the two possible logic values "0" and "1" of these binary data.

However, multi-level memories exist, with more than two levels, which can store logical data capable of taking more than two logic values.

This gives high-density memories that save space due to their ability to store a larger quantity of logical data, and which can be advantageously used, for example, in artificial intelligence applications requiring artificial neural networks (ANN) and convolutional neural networks (CNN).

There is a need to offer a solution for the reliable, simple and fast reading of such multi-level memories.

SUMMARY

According to one implementation and embodiment, the read current output by the memory is compared with successively selected reference currents using a dichotomous algorithm.

According to one aspect, a method is proposed for managing the operation of a multi-level non-volatile memory cell.

The memory cell has N levels, N being even and greater than two, corresponding respectively to N logical data that can be stored in the memory cell and to N corresponding read current ranges.

The method according to this aspect comprises reading the datum stored in the memory cell including successive comparisons of a read current output by the memory cell with reference currents selected from a set of N−1 reference currents having values respectively lying between two different successive ranges, using a dichotomous algorithm starting with the reference current having the median value.

Reading can comprise providing an adjustable current source and successively adjusting the current source to cause it to output the successively selected reference currents.

However, according to an advantageous implementation, reading comprises placing a reference memory cell that is structurally identical to the memory cell, next to the memory cell, and successively reading this reference memory cell to cause it to output the corresponding reference currents.

The memory cell is, by way of a non-limiting example, a phase-change type memory cell.

When the reference memory cell is a phase-change memory cell, outputting a reference current advantageously comprises placing the reference memory cell in a SET state and applying a selected reference voltage to the reference memory cell to cause it to output the corresponding reference current.

The method can further comprise programming the memory cell to the desired level and checking the programming by using said reading of the memory cell.

When the memory cell is a phase-change memory cell, programming the memory cell to a level lower than the maximum level advantageously comprises programming the memory cell to the maximum level, then successively outputting erase pulses erasing the memory cell, respectively followed by successively reading the memory cell until a read current corresponding to the desired programming level is reached.

That said, other methodologies for programming the memory cell to a level lower than the maximum level, are also possible.

According to another aspect, a multi-level non-volatile memory device comprises (minimally): at least one non-volatile memory cell configured to be in one of N levels or states, N being even and greater than two, corresponding respectively to N logical data values (each value being a datum) that can be stored in the memory cell and to N corresponding read current ranges; a read circuit configured to read the datum stored in the memory cell by carrying out successive comparisons of a read current output by the memory cell with reference currents selected from a set of N−1 reference currents having values respectively lying between two different successive ranges, using a dichotomous algorithm starting with the reference current having the median value.

According to one embodiment, the reading circuit comprises a reference memory cell located next to the memory cell and structurally identical to the memory cell, and a read module configured to perform successive readings of this reference memory cell to cause it to output the corresponding reference currents.

According to one embodiment, the reading circuit comprises an adjustable current source and a control circuit configured to make successive adjustments to the current source to cause it to output successively selected reference currents.

According to one embodiment, the memory cell is, by way of a non-limiting example, a phase-change type memory cell.

According to one embodiment, the phase-change type reference memory cell is in a SET state and the read module is configured to apply a selected reference voltage to the reference memory cell to cause it to output the corresponding reference current.

According to one embodiment, the device further comprises a processing circuit configured to program the memory cell to the desired level and check the programming by using said reading of the memory cell.

When the memory cell is a phase-change memory cell, the processing circuit is advantageously configured to program the memory cell to a level lower than the maximum level by programming the memory cell to the maximum level, then by successively outputting erase pulses erasing the memory cell, respectively followed by successively reading the memory cell until a read current corresponding to the desired programming level is reached.

That said, the processing circuit can be configured to apply other methodologies for programming the memory cell to a level lower than the maximum level.

BRIEF DESCRIPTION OF THE DRAWINGS

Other advantages and features of the invention will become apparent upon examining the detailed description of non-limiting embodiments and implementations of the invention, and from the accompanying drawings in which.

DETAILED DESCRIPTION

Figure 1:
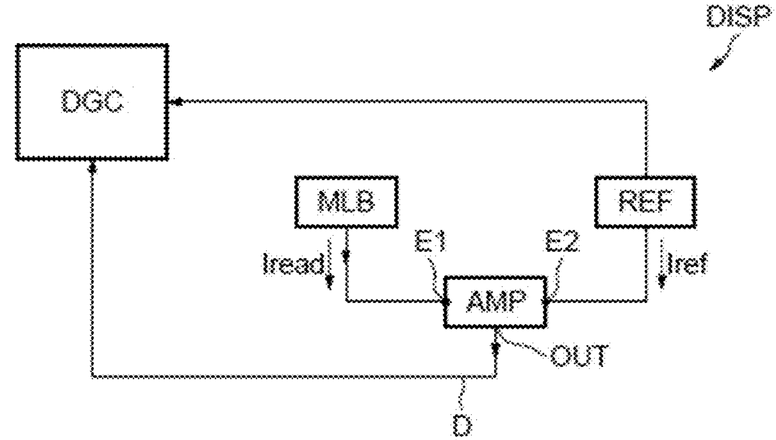
FIG. 1 shows a multi-level non-volatile memory device comprising at least one non-volatile memory cell.

In FIG. 1, the reference DISP denotes a multi-level non-volatile memory device comprising at least one non-volatile memory cell MLB storing a datum having any one of N levels, N being even and greater than two.

N is, for example, equal to 4, but is not limited thereto.

These levels correspond respectively to N logical data values that can be stored in the memory cell and to N corresponding read current ranges.

For example, when N is equal to 4, the 4 corresponding logic data values can be respectively equal to 00, 01, 10 and 11, in binary format.

The device DISP further comprises a circuit for reading the datum stored in the memory cell and configured, as will be seen in more detail hereinbelow, to carry out successive comparisons of a read current Iread output by the memory cell MLB with reference currents Iref selected from a set of N−1 reference currents having values respectively lying between two different successive ranges, using a dichotomous algorithm starting with the reference current having the median value.

Each reference current is output by an adjustable reference circuit REF, one possible structure whereof will be described in more detail hereinbelow.

In addition to the reference circuit REF, the reading circuit in this case comprises a processing circuit DGC, for example a microcontroller, capable of adjusting the reference circuit REF and of retrieving information representative of the datum D stored in the memory cell MLB.

This information is output by a conventional sense amplifier AMP, forming part of the reading circuit, and including a first input E1 connected to the memory cell MLB for receiving the read current Iread, a second input E2 connected to the reference circuit REF for receiving the reference current Iref, and an output OUT intended to output the information representative of the stored datum D.

Although the memory cell can be any type of non-volatile memory cell, for example a memory cell of the floating gate type with a buried selection transistor, or a memory cell of the electrically erasable programmable read-only memory (EEPROM) type, one implementation and embodiment will now be described wherein, unless specified otherwise, the memory cell MLB is of the phase-change type.

As is well known to a person skilled in the art, phase-change memories are non-volatile memories that rely on the properties of phase-change materials.

More specifically, a phase-change material is able to switch from a low-resistance state to a high-resistance state under heating.

Phase-change memories take advantage of the fact that the electric resistances of the different states of the phase-change materials are different in order to store data.

More specifically, when the memory is intended to store a binary logic value having two logic states, the phase-change material is able to switch from a High-Resistance State (HRS) to a Low-Resistance State (LRS) under the effect of heat and the Joule effect generated by the application of a current between electrodes.

Switching from a high-resistance state to a low-resistance state corresponds to a programming or activation operation referred to as "SET", i.e., an operation writing a binary datum value, for example a logic value 1. The memory is thus in a so-called "SET" state.

Switching from a low-resistance state to the high-resistance state corresponds to an erase or deactivation operation referred to as "RESET", i.e., an operation to write an opposite binary datum value, for example a logic value 0. The memory is thus in a so-called "RESET" state.

To carry out a programming or SET operation, the phase-change material is heated between its crystallization and melting temperatures and then slowly cooled to obtain a crystalline phase. The current pulse thus decays slowly.

However, in order to make the phase-change material amorphous (the erase or RESET operation), it is heated above its melting temperature and then rapidly cooled to set it in the amorphous state at room temperature. The current pulse is thus very short and abrupt.

As will be seen in more detail hereinbelow, when the memory is a multi-level memory, i.e., when it is capable of storing logical data that can take N different logic values (N being greater than two), intermediate states between the RESET state and the SET state can be provided for the memory cell.

Thus, when N is equal to 4, two intermediate states can be provided, which intermediate states correspond respectively to a "partially RESET" state and to a "partially SET" state.

The various states of the memory cell are differentiated by the value of the read current Iread output by the memory cell.

Figure 2:
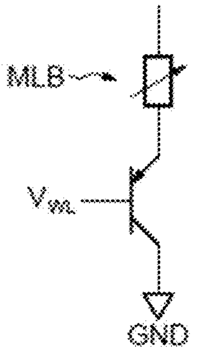
FIG. 2 diagrammatically illustrates a conventional and well-known structure of a phase-change memory cell.

FIG. 2 diagrammatically illustrates a conventional and well-known structure of a phase-change memory cell MLB.

More specifically, it includes a memory element, for example containing germanium, antimony and tellurium, which have different resistance values depending on the RESET/partially RESET/partially SET/SET states of the memory.

This memory element is associated with a heating device, for example two electrodes, which, when a current flows therethrough, heats the memory element by Joule effect to vary the resistance thereof.

The memory cell MLB is associated with a selection transistor TS, in this case a bipolar transistor PNP connected in series between the memory element and a neutral supply point, typically the ground GND.

The base of the bipolar transistor is connected to a word line and is intended to receive a voltage $V_{WL}$ switching this transistor on so as to allow current to flow through the heating device in order to heat the memory element.

It goes without saying that the bipolar transistor TS could be replaced by an MOS transistor, for example by a PMOS transistor.

A memory cell CEL in a SET state is, for example, intended to output a read current Iread in the order of, for example, 12 microamperes.

A memory cell CEL in its RESET state is capable of outputting a current Iread of, for example, zero or almost zero amperes.

A memory cell CEL in its partially RESET state is capable of outputting, for example, a current Iread in the order of 4 microamperes.

A memory cell CEL in its partially SET state is capable of outputting, for example, a current Iread in the order of 8 microamperes.

These currents are obtained in the presence, for example, of a voltage applied to the memory element of between 1.5 and 1.8 volts for a bipolar selection transistor TS and between 0.4 and 0.5 volts for a selection transistor of the MOS type.

Figure 3:
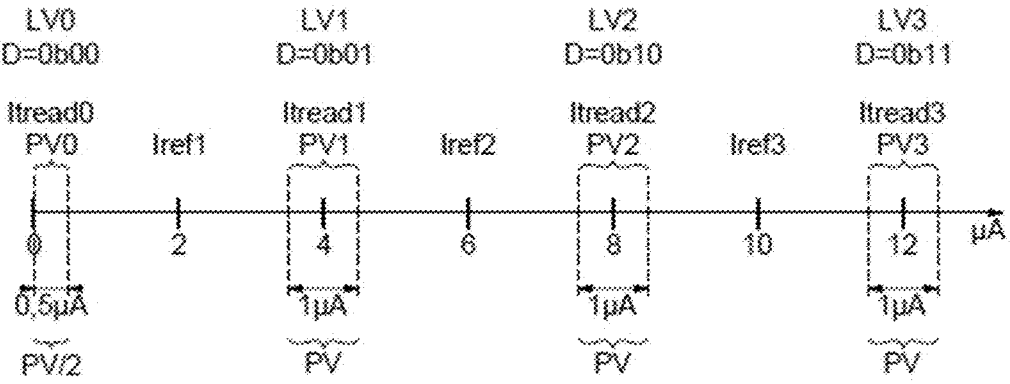
FIG. 3 illustrates various read currents.

FIG. 3 in particular illustrates these various read currents.

In practice, and by way of a non-limiting example, the values 0, 4, 8 and 12 microamperes correspond to target read current values Itread0, Itread1, Itread2, and Itread3.

In practice, the effective read currents can lie within the value ranges PV1, PV2 and PV3 around the target values Itread1, Itread2 and Itread3 and within the value range PV0 starting at the target value Itread0.

For simplification purposes, the value ranges PV1-PV3 have the same amplitude PV and the value range PV0 has an amplitude equal to PV/2.

This amplitude PV depends, in particular, on the sensitivity of the sense amplifier AMP and/or on a tolerance when programming/erasing the memory cell.

By way of a non-limiting example, the amplitude PV can be taken to be equal to 1 microampere.

In practice, however, in the case of a phase-change memory cell, the range PV can, under certain conditions, increase as the conductance increases.

The value range PV3 can thus be higher than the value range PV2, which can itself be higher than the value range PV1, which itself can be higher than the value range PV0.

However, for non-volatile floating-gate memory cells, the amplitude PV remains more or less constant.

As illustrated in FIG. 3, these target values and their associated value range define in this case, for the memory cell MLB, four levels LV0, LV1, LV2 and LV3 respectively corresponding to the following four binary logic values of the datum D: 00, 01, 10 and 11.

Three reference currents Iref1, Iref2 and Iref3, intended to be output by the reference circuit REF, are defined and have values lying between adjacent ones of the value ranges PV0-PV3, for example in the middle of the intervals between the adjacent value ranges.

Thus, in this case, the values of these reference currents Iref1, Iref2 and Iref3 are equal to, for example, 2, 4 and 6 microamperes respectively.

Figure 4:
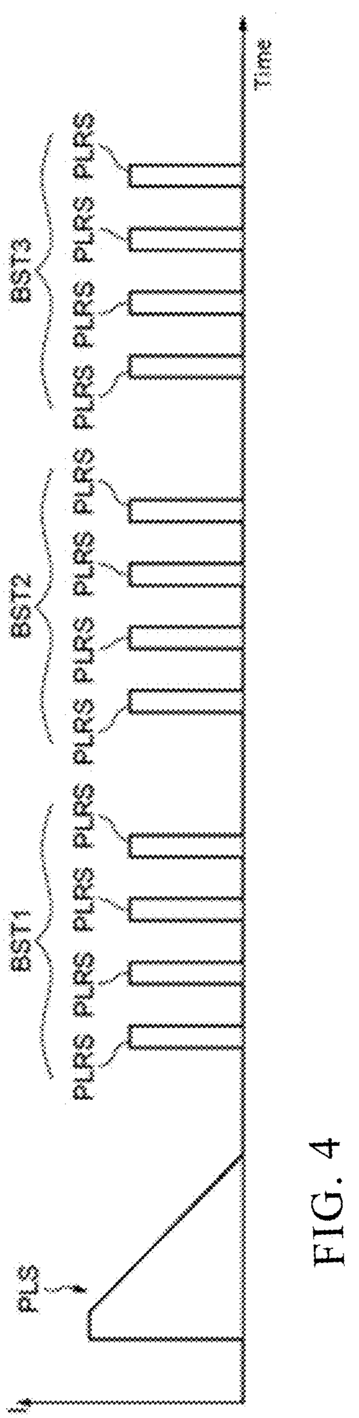
FIGS. 4 and 5 illustrate an example of the programming of the memory cell.
Figure 5:
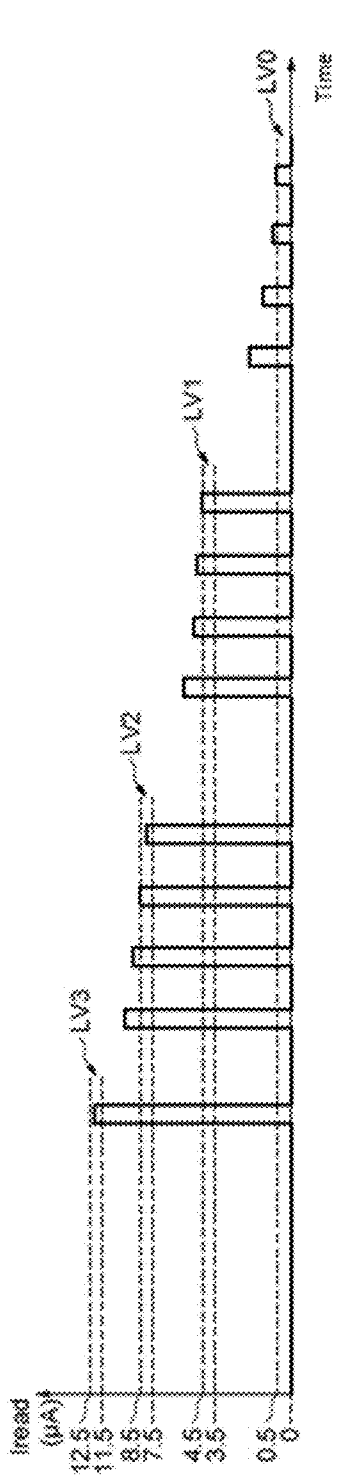

FIGS. 4 and 5 illustrate an example of the programming of the memory cell MLB.

This programming is carried out under the control of a processing circuit incorporated in the microcontroller DGC.

A programming pulse PLS is firstly output (FIG. 4) to the memory cell so as to place it in its SET state.

The memory cell thus has level LV3 (FIG. 5) corresponding to a read current Iread of between 11.5 and 12.5 microamperes.

If the memory cell is to be programmed to level LV2, corresponding to a read current Iread of between 7.5 and 8.5 microamperes, a burst BST1 of erase pulses PLRS is output to the memory cell until the desired read current is reached.

If the memory cell is to be programmed to level LV1, corresponding to a read current Iread of between 4.5 and 3.5 microamperes, another burst BST2 of erase pulses PLRS is output to the memory cell until the desired read current is reached.

If the memory cell is to be RESET to level LV0, corresponding to a read current Iread of between 0.5 and 0 microamperes, another burst BST3 of erase pulses PLRS is output to the memory cell until the desired read current is reached.

In practice, after each erase pulse in a given burst, the memory cell is read, as explained hereinbelow, in order to check the read current obtained and decide whether another erase pulse is required.

However, other programming schemas are possible.

More specifically, a first cycle can be carried out, which cycle includes a programming pulse, followed by an erase pulse, followed by a reading of the memory cell. If the desired read current is not obtained, the same cycle is repeated, but with an erase pulse of a more adjusted amplitude. These cycles are repeated until the desired read current is obtained.

Figure 6:
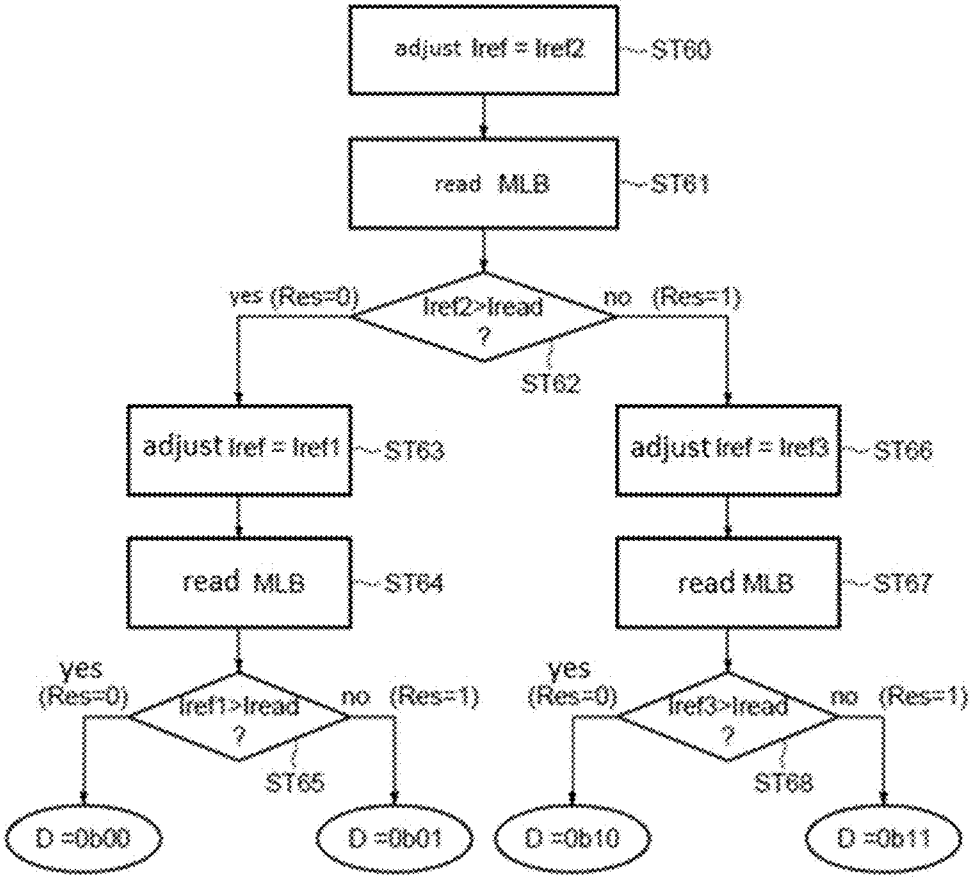
FIG. 6 shows a method for reading the memory cell in order to determine the logic datum stored therein.

Reference is now made more particularly to FIG. 6 to describe one implementation of a method for reading the memory cell MLB in order to determine the logic datum stored therein.

The microcontroller DGC adjusts the reference circuit so as to cause it to output the reference current Iref2 having the median value from among the values of the set of reference currents Iref1-Iref3 (step ST60).

The reading circuit then reads the memory cell MLB (step ST61) by applying a read voltage to the memory cell so as to cause it to output the read current Iread.

The sense amplifier AMP then compares (step ST62) the read current Iread with the reference current Iref2.

If the reference current Iref2 is less than the current Iread, then the result Res output by the amplifier AMP corresponds to a logic “1”.

This means that the read current Iread lies in the interval to the right of Iref2 in FIG. 3.

If the reference current Iref2 is greater than the current Iread, then the result Res output by the amplifier AMP corresponds to a logic “0”.

This means that the read current Iread lies in the interval to the left of Iref2 in FIG. 3.

The microcontroller will thus implement a dichotomous algorithm to halve the interval considered and continue to do so in order to obtain the value of the datum D stored in the memory cell.

More specifically, if in step ST62 the result Res is 1, the microcontroller will adjust the reference circuit REF so that it outputs the reference current Iref3 (step ST66).

The reading circuit reads the memory cell MLB again (step ST67).

The corresponding read current Iread is compared in the sense amplifier AMP with the reference current Iref3.

If Iref3 is less than Iread, which corresponds to a result Res of “1”, this means that the current Iread lies in the interval to the right of Iref3 in FIG. 3.

As a result, since there is no longer any interval to halve and thus no longer any uncertainty about the value of the logical datum, the datum D in this case has the logic value 0b11.

If Iref3 is greater than Iread, which corresponds to a result Res of "0", this means that the current Iread lies in the interval to the left of Iref3 in FIG. 3.

As a result, since there is no longer any interval to halve and thus no longer any uncertainty about the value of the logical datum, the datum D in this case has the logic value 0b10.

More specifically, if in step ST62 the result Res is 0, the microcontroller will adjust the reference circuit REF so that it outputs the reference current Iref1 (step ST63).

The reading circuit read the memory cell MLB again (step ST64).

The corresponding read current Iread is compared in the sense amplifier AMP with the reference current Iref1.

If Iref1 is less than Iread, which corresponds to a result Res of "1", this means that the current Iread lies in the interval to the right of Iref1 in FIG. 3.

As a result, since there is no longer any interval to halve and thus no longer any uncertainty about the value of the logical datum, the datum D in this case has the logic value 0b01.

If Iref1 is greater than Iread, which corresponds to a result Res of "0", this means that the current Iread lies in the interval to the left of Iref1 in FIG. 3.

As a result, since there is no longer any interval to halve and thus no longer any uncertainty about the value of the logical datum, the datum D in this case has the logic value 0b00.

Figure 7:
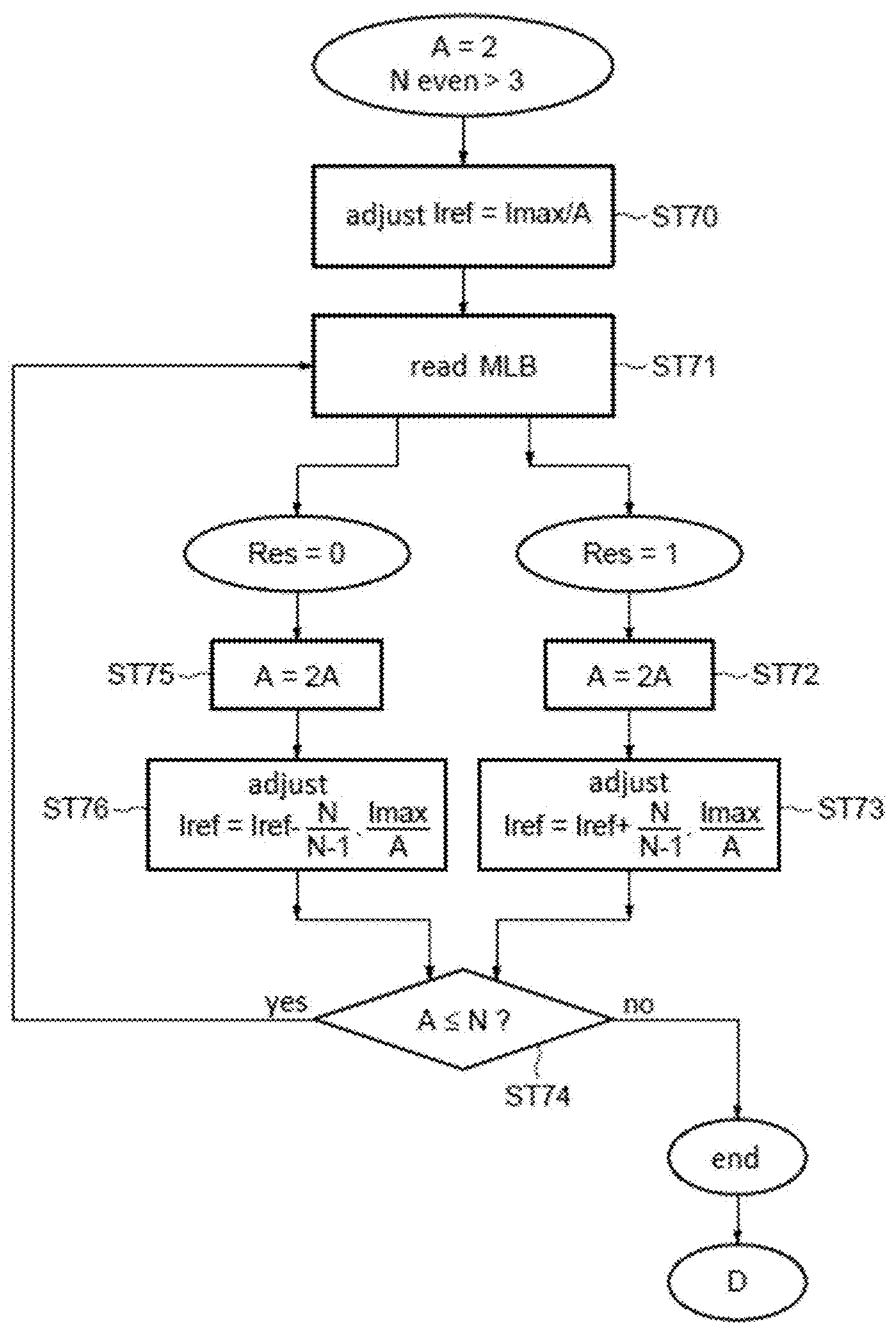
FIG. 7 illustrates the implementation of the dichotomous algorithm.

FIG. 7 illustrates the implementation of the dichotomous algorithm in the general case where N is even and greater than 3.

The algorithm uses a parameter A, which is set to the value 2.

The microcontroller adjusts the reference circuit REF such that it outputs a current Iref equal to Imax/A (step ST70).

Imax denotes the maximum of the target values for the read currents.

In the case shown in FIG. 6, Imax was the value of the current Itread3, i.e., 12 microamperes.

Then, in step ST71, the memory cell MLB is read.

If the result Res is equal to 1, the value of A is doubled (step ST72) and, in step ST73, the microcontroller adjusts the reference circuit REF such that it outputs a current Iref, whose value is equal to the previous value increased by (N×Imax)/(A×(N−1)).

If the result Res is equal to 0, the value of A is doubled (step ST75) and, in step ST76, the microcontroller adjusts the reference circuit REF such that it outputs a current Iref, whose value is equal to the previous value decreased by (N×Imax)/(A×(N−1)).

If, in step ST74, A is less than or equal to N, the microcontroller circles back to step ST71.

If, on the other hand, A is greater than N, this means that the entire dichotomy has been performed and that the value of the datum D has been determined.

Figure 8:
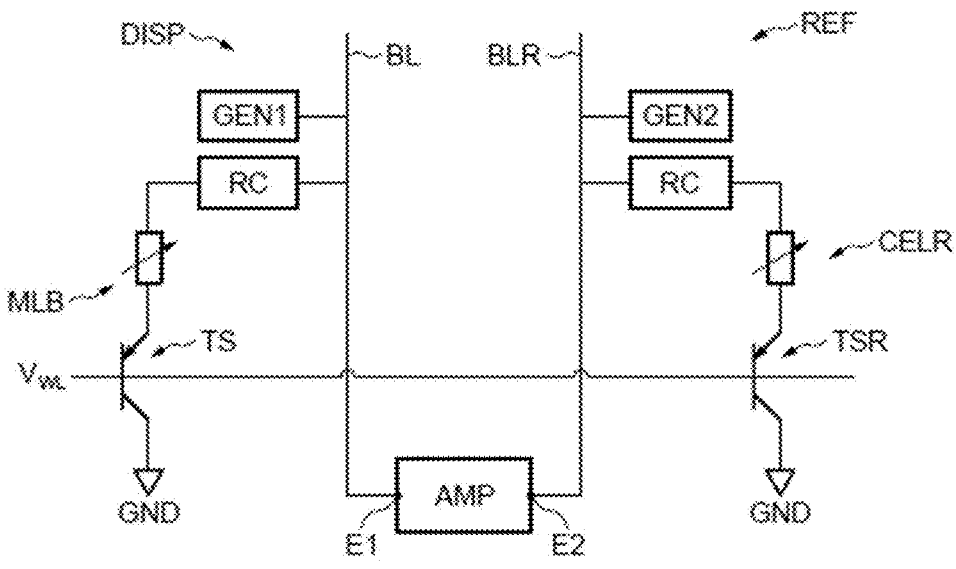
FIGS. 8 and 9 illustrate an embodiment and implementation of a reference circuit.
Figure 9:
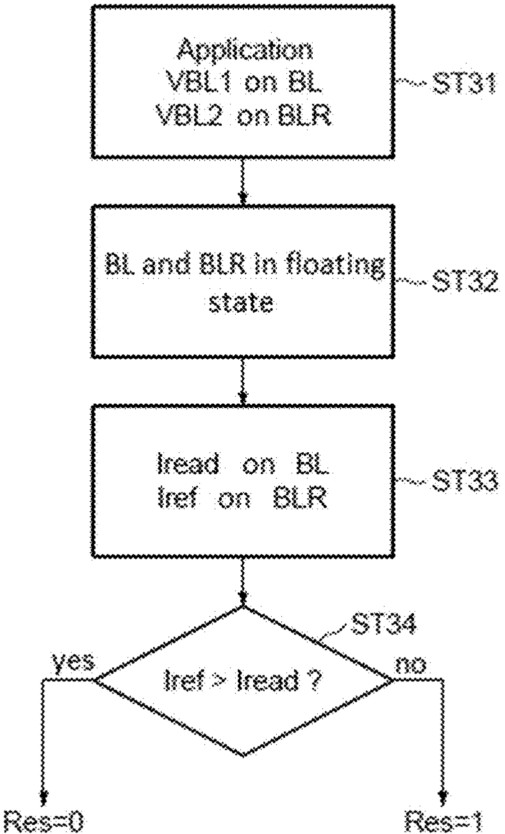

Reference is now made more particularly to FIGS. 8 and 9 to describe an embodiment and implementation of a reference circuit REF.

The features of this embodiment and implementation provide for the use of a reference memory cell CELR (FIG. 8) of the phase-change type for the reference circuit REF.

The memory cell MLB and the reference memory cell CELR have an identical structure and are placed side by side.

The reference memory cell is programmed in a SET state and a read module is configured to apply a selected reference voltage to the reference memory cell to cause it to output the corresponding reference current.

The base of the bipolar selection transistor TSR associated with the reference memory cell CELR is also intended to receive the voltage $V_{WL}$.

It goes without saying that the bipolar transistor TSR could be replaced by an MOS transistor, for example by a PMOS transistor.

The memory device DISP further includes a bit line BL associated with the memory cell MLB and a bit line BLR associated with the reference memory cell CELR.

The reference RC denotes the stray resistances and capacitances resulting from interconnections between the various elements of the device DISP.

The reading module includes a first voltage generator GEN1 and a second voltage generator GEN2 intended to be respectively connected to the bit lines BL and BLR.

Moreover, the bit lines BL and BLR are respectively connected to the two inputs E1 and E2 of the sense amplifier AMP.

The memory cell MLB is connected to the bit line BL, whereas the reference cell CELR is connected to the bit line BLR.

The fact that the memory cell MLB and the reference memory cell are placed side by side ensures that the voltages applied to the bases of the selection transistors TS and TSR are substantially the same and that the read paths of the memory cell MLB and the read paths of the reference memory cell CELR are correctly balanced.

For information, a distance of between 10 micrometers and 20 micrometers between the memory cell MLB and the reference memory cell CELR can advantageously be selected for 18-nanometer technology.

It goes without saying that this distance value is only an example and that a person skilled in the art will be able to adjust this value, where necessary, depending in particular on the features of the memory cells and of the read schemas.

The reading of the cell MLB is a single-input read (as opposed to a differential read) described with reference to FIG. 9.

In a step ST31, a voltage VBL1 is applied to the bit line BL and a voltage VBL2 is applied to the bit line BLR.

These two voltages VBL1 and VBL2 are respectively output by the two voltage generators GEN1 and GEN2.

The voltage VBL1 generates a current corresponding to the SET state of the memory cell MLB (typically 12 microamperes).

For a bipolar selection transistor, a voltage VBL1 of between 1.5V and 1.8V will be selected.

The voltage VBL2 is less than or equal to the voltage VBL1, in order to cause the selected reference current to be output from the reference memory cell CELR.

By way of example, in order to obtain the reference current Iref 3 (10 microamperes), a voltage VBL2 of between 1.5V and 1.8V will be used for a bipolar selection transistor.

By way of example, in order to obtain the reference current Iref 2 (6 microamperes), a voltage VBL2 of between 1.35V and 1.7V will be used for a bipolar selection transistor.

By way of example, in order to obtain the reference current Iref 1 (2 microamperes), a voltage VBL2 of between 1.2V and 1.55V will be used for a bipolar selection transistor.

Once the bit lines BL and BLR have been biased with voltages VBL1 and VBL2 in step ST31, the bit lines BL and BLR are set to a floating state (step ST32), for example by disconnecting the two generators GEN1 and GEN2 from the bit lines BL and BLR or by stopping generation.

As the transistors TS and TSR are on, the memory cell MLB draws the current Iread flowing on the bit line BL, whereas the reference memory cell CELR draws the reference current Iref flowing on the bit line BLR (step ST33).

These two currents Iref and Iread are compared (step ST34) in the sense amplifier AMP.

If the current Iref is less than the current Iread, then the result Res is equal to 1.

If the current Iread is greater than the current Iref, then the result Res is equal to 0.

Figure 10:
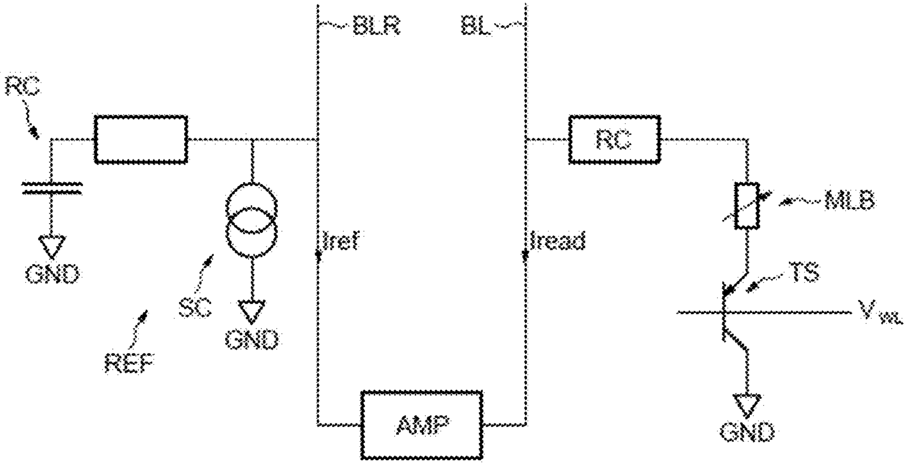
FIG. 10 illustrates use of an adjustable current source as the reference circuit instead of a reference memory cell.

It is also possible, as illustrated in FIG. 10, to use an adjustable current source SC as the reference circuit REF, instead of a reference memory cell CELR.

The microcontroller DGC incorporates control circuit capable of adjusting the current source SC to cause it to output the selected reference current.

The current source SC thus draws a current Iref (selected from the set of currents Iref1-Iref3) on the bit line BLR, whereas the memory cell MLB draws a current Iread on the bit line BL.

The two currents are compared in the sense amplifier AMP.

However, the single-input mode reading using the reference memory cell CELR is more precise than the single-input reading method using a current source, because it is less sensitive to the resistance difference of the memory cell MLB and to the structural differences observed between a memory cell and a current source.

Typically, in practice, the memory device comprises a memory map having a matrix of memory cells organized into rows and columns.

Figure 11:
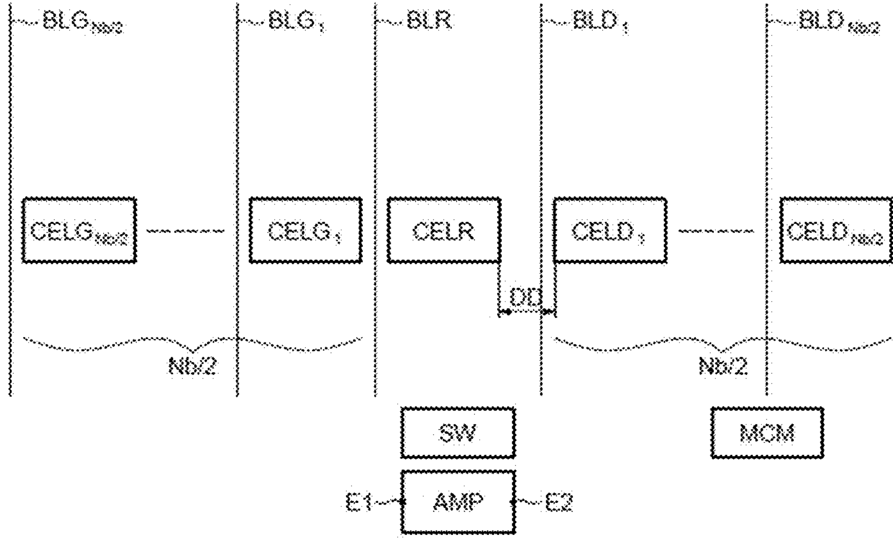
FIG. 11 illustrates a single group of a plurality of memory cells.

Thus, as illustrated in FIG. 11, wherein the memory cells are referenced with the group CEL, a row of memory cells includes groups of a plurality of memory cells.

For simplification purposes, FIG. 11 illustrates a single group of a plurality of memory cells $CELG_i$ and $CELD_i$ respectively coupled to the first input E1 of the sense amplifier AMP via controllable switches SW.

A single reference memory cell CELR is associated with this group of memory cells CEL.

This saves considerable space on silicon.

Moreover, this reference memory cell is connected to the second input E2 of the sense amplifier as described hereinabove.

Control circuit MCM, for example a logic circuit, is thus configured to successively select said switches SW so that the reading circuit can successively read each memory cell MLB as explained hereinabove.

In practice, a group of Nb memory cells associated with a single reference memory cell CELR could be selected, for example.

Moreover, so as not to distance the memory cells in this group too far from the reference memory cell, a number Nb of memory cells is selected, and the memory cells are divided into two sub-groups of Nb/2 memory cells.

Moreover, as illustrated in FIG. 11, the reference memory cell CELR is bordered by a first sub-group of Nb/2 memory cells $CELG_1$-$CELG_{Nb}/2$ and by a second group of Nb/2 memory cells $CELD_1$-$CELD_{Nb/2}$.

The distance DD between each memory cell $CELG_1$-$CELD_1$ immediately adjacent to the reference memory cell is, as indicated hereinabove, preferably in the order of 10 to 20 microns.

Moreover, a person skilled in the art will select the value of Nb/2 so that the memory cells $CELG_{Nb/2}$-$CELD_{Nb/2}$ located the furthest from the reference cell are not excessively impacted by a too great distance relative to the reference memory cell CELR.

For example, groups of 8 memory cells can be selected on each row of the memory map.

Each group is thus associated with a reference cell bordered on the left and right by 4 memory cells.

Moreover, for example, the first cell on the left $MLBG_1$ is firstly read, then the other cells on the left are successively read until the cell $MLBG_{Nb/2}$ is read.

Subsequently, the first cell on the right $MLBD_1$ is read, then the other cells on the right are successively read until the cell $MLBD_{Nb/2}$ is read.

It goes without saying that any other reading order is possible.

As indicated hereinabove, the invention, and in particular the method for reading using a dichotomous algorithm, applies to any type of multi-level non-volatile memory, for example a floating-gate memory with a selection transistor buried in the semiconductor substrate.

However, with this type of memory, the various levels are programmed by completely erasing the memory to obtain level LV0, then by successively programming the memory to obtain levels LV1 and following until the desired level is obtained.

This is thus the reverse of what occurs for a phase-change memory, where the memory is firstly programmed to the highest level (SET) and then gradually erased to obtain the lower levels until the desired level is obtained.

The invention claimed is:

1. A method for managing operation of a multi-level non-volatile memory cell, the multi-level non-volatile memory cell comprising a phase-change type memory cell having N levels, N being even and greater than two, corresponding respectively to N logical data values that can be stored in the multi-level non-volatile memory cell and to N corresponding read current ranges, the method comprising:

- reading the multi-level non-volatile memory cell by performing successive comparisons of a read current output by the multi-level non-volatile memory cell on a read bit line with reference currents selected from a set of N−1 reference currents having values respectively lying between two different successive ranges using a dichotomous algorithm starting with a reference current having a median value; and
- generating the reference currents by:
  - providing a reference memory cell connected to a reference bit line, the reference memory cell comprising a phase-change type memory cell that is structurally identical to the multi-level non-volatile memory cell;
  - placing the reference memory cell in a SET state; and
  - applying a plurality of different reference voltages to the reference bit line to cause the reference memory cell to correspondingly generate the reference currents.

2. The method according to claim 1, further comprising programming the multi-level non-volatile memory cell to the desired level and checking the programming of the multi-level non-volatile memory cell.

3. The method according to claim 1, wherein the multi-level non-volatile memory cell is programmed to a level lower than a maximum level by programming the multi-level non-volatile memory cell to the maximum level, and then successively outputting erase pulses erasing the multi-level non-volatile memory cell, respectively followed by successively reading the multi-level non-volatile memory cell until a read current corresponding to the desired programming level is reached.

4. A multi-level non-volatile memory device, comprising:

at least one non-volatile memory cell comprising a phase-change type memory cell having N levels, N being even and greater than two, corresponding respectively to N logical data values that can be stored in the multi-level non-volatile memory cell and to N corresponding read current ranges; and a reading circuit configured to read the multi-level non-volatile memory cell by carrying out successive comparisons of a read current output by the multi-level non-volatile memory cell on a read bit line with reference currents selected from a set of N−1 reference currents having values respectively lying between two different successive ranges using a dichotomous algorithm starting with the reference current having a median current value;

wherein the reading circuit comprises:

a reference memory cell connected to a reference bit line, the reference memory cell comprising a phase-change type memory cell that is structurally identical to the multi-level non-volatile memory cell;

wherein the reference memory cell is programmed in a SET state; and a voltage generator circuit configured to apply a plurality of different reference voltages to the reference bit line to cause the reference memory cell to correspondingly generate the reference currents.

5. The device according to claim 4, further comprising:

a processing circuit configured to program the multi-level non-volatile memory cell to the desired level; and wherein the reading circuit is configured to check the programming by reading the multi-level non-volatile memory cell.

6. The device according to claim 4, further comprising: a processing circuit configured to program the multi-level non-volatile memory cell to the desired level, wherein the reading circuit is configured to check the programming by reading the multi-level non-volatile memory cell, and wherein the processing circuit is configured to program the multi-level non-volatile memory cell to a level lower than a maximum level by programming the multi-level non-volatile memory cell to the maximum level, then by successively outputting erase pulses erasing the multi-level non-volatile memory cell, respectively followed by successively reading the multi-level non-volatile memory cell until a read current corresponding to the desired programming level is reached.

* * * * *